Figure 1:
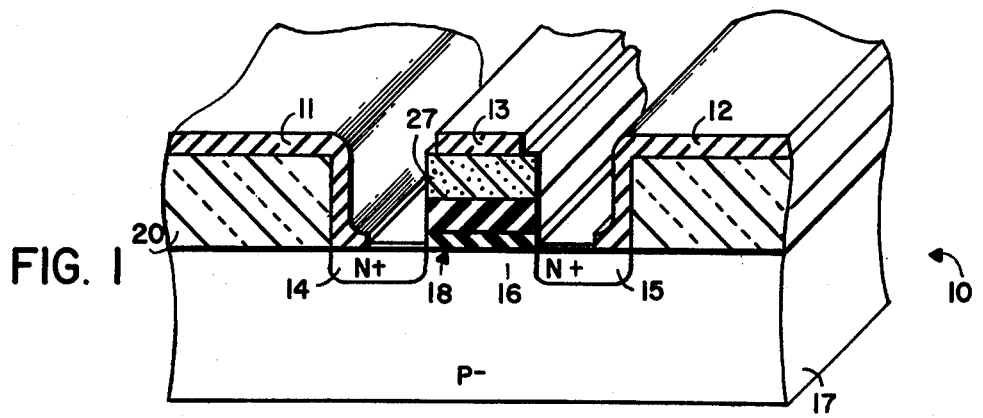

United States Patent [19]

Zimmer

[11] 4,140,548
[45] Feb. 20, 1979

[54] MOS SEMICONDUCTOR PROCESS UTILIZING A TWO-LAYER OXIDE FORMING TECHNIQUE

[75] Inventor: Jerry W. Zimmer, San Jose, Calif.

[73] Assignee: Maruman Integrated Circuits Inc., Sunnyvale, Calif.

[21] Appl. No.: 907,887

[22] Filed: May 19, 1978

[51] Int. Cl.$^2$ ............... H01L 21/324; H01L 21/265; H01L 21/31

[52] U.S. Cl. .................................. 148/1.5; 29/571; 148/174; 148/187; 357/23; 357/54; 427/93; 427/95

[58] Field of Search ............ 148/1.5, 174, 187; 357/23, 54; 29/571; 427/93, 95

[56] References Cited

U.S. PATENT DOCUMENTS

| | | | |
|---|---|---|---|
| 3,158,505 | 11/1964 | Sandor | 427/95 |
| 3,184,329 | 5/1965 | Burns | 427/93 X |
| 3,243,314 | 3/1966 | Lehman et al. | 427/95 |
| 3,532,539 | 10/1970 | Tokuyama et al. | 427/95 |
| 3,547,786 | 12/1970 | Rigo | 357/54 X |
| 3,580,745 | 5/1971 | Kooi et al. | 148/1.5 |
| 3,615,873 | 10/1971 | Sluss et al. | 148/1.5 |
| 3,627,589 | 12/1971 | Sprague | 148/187 X |
| 3,925,107 | 12/1975 | Goula et al. | 357/23 X |

OTHER PUBLICATIONS

Goula, R. A., "Composite Dielectric Layer" I.B.M. Tech. Discl. Bull., vol. 14, No. 9, Feb. 1972, p. 2609.
Bratter et al., "High-Temperature Pyrolytic Deposition Process".
Ibid., vol. 15, No. 2, Jul. 1972, p. 685.
Burkhardt et al., "Post-Oxidation Annealing . . . Levels" Ibid., vol. 18, No. 3, Aug. 1975, p. 753.

*Primary Examiner*—L. Dewayne Rutledge
*Assistant Examiner*—W. G. Saba
*Attorney, Agent, or Firm*—Harry Max Weiss

[57] ABSTRACT

Process for the manufacture of MOS devices by providing wafer of P-semiconductor grade silicon in a deposition reactor. The wafer is heated to a temperature of approximately 950° C. while subjecting the wafer to dry oxygen gas to produce between a very thin layer (50–250Å) of silica ($SiO_2$) on a surface of the wafer. While elevating the temperature of the wafer to approximately 1000° C., the chamber is purged with nitrogen and then hydrogen gas. After an introduction of carbon dioxide gas into the chamber, silane ($SiH_4$) or dichlorosilane gas is bled into the chamber. The silane reacts with the $CO_2$ to deposit $SiO_2$ on the previously formed thermal $SiO_2$. The two layers of $SiO_2$ may then be annealed to provide a highly coherent, defect-free gate oxide for MOS integrated circuits.

9 Claims, 5 Drawing Figures

MOS SEMICONDUCTOR PROCESS UTILIZING A TWO-LAYER OXIDE FORMING TECHNIQUE

This invention relates to semiconductor devices and more particularly to an improved process for the manufacture of metal-oxide-semiconductor (MOS) field effect devices. Still more particularly, this invention relates to an improved process for the manufacture of n-channel, self-aligned gate MOS device.

In general, semiconductor devices are either of the bipolar or unipolar types and, as used herein, the term device will be understood to include both dicrete and integrated circuit forms. Unipolar, field effect, transistors may be of either the junction type or metal-oxide semiconductor (MOS) type. Since it is to this latter type that this invention most directly relates, it should not be necessary to describe the other types but only to point that an MOS transistor comprises three electrodes, (1) a source, (2) a drain and (3) a gate electrode, connected electrically to three semiconductor regions, (1) a source, (2) a drain and (3) a channel region. These regions are defined in a body of a semiconductor material of a first conductivity type by bounding two sides of an area thereof by regions of a second conductivity type. Thus, the two regions of second conductivity type are the source and drain regions and the channel is the region defined there between. The source and drain electrodes are ohmically connected to these regions. Overlying the channel region is insulating layer which has a conductive (metal) layer thereon. This latter conductive layer is capacitively coupled to the channel and serves as the gate electrode.

Conductivity types in semiconductor material are provided by use of donors to produce N type material and acceptors to produce P type material. If the source and drain regions of an MOS device are of P type material, the channel is of N type material. Thus, majority carrier conduction across the channel is by holes and the device is referred to as a p-channel or PMOS device. On the other hand, if the conductivity types are reversed, the majority carrier conduction across the channel is by electrons and the device is referred to as n-channel or NMOS. Since the rate of movement in semiconductor material of electrons is several times faster than holes (electrons move at approximately the speed of light), n-channel devices switch more rapidly than p-channel devices and are therefor, from this standpoint, much preferred.

Another factor affecting speed of operation is the distance of travel of the carrier. Obviously, the most significant dimension in an MOS device relative to this factor is channel width, that is the distance between the most adjacent portions of the source and drain regions. Thus it is desirable to make channel width as small as possible. Reducing channel width is, in general, desirable since device size is reduced and hence packing density, i.e. number of devices per unit area, is increased.

A further factor affecting speed of operation is capacitance. As noted above, the gate electrode of an MOS device is capacitively coupled to the channel. Obviously, for the device to be operative, a necessary minimum of capacitance must always be present. Therefore, reduction of channel width reduces unit area and capacitance. Also, elimination of unnecessary overlap between the source and drain regions and the gate electrode serves to minimize capacitance. Thus, a type of process which results in a self-aligned structure is highly to be desired.

Since the switching speed of the MOS device will be affected by voltage rise time it is desirable that the devices be low voltage and hence that the thickness of the gate oxide be thin. Obviously, the gate oxide thickness cannot be so thin that the conductor punches through to form an ohmic contact to the channel region. The thickness of the gate oxide will thus be a compromise between the desired minimum thickness and a thickness achievable without punch through.

In an MOS integrated circuit structure conductor lines must be present to connect between individual transistor structures and to the outside world-usually at the edge of the circuit chip. Thus, the insulating layer structure underlying the conductor lines must be thick enough to minimize capacitance throughout the circuit.

Most of the desirable characteristics of the foregoing are provided by a process in which an overall relatively thick layer of silicon dioxide is thermally grown on a wafer of silicon. By masking and etching, windows are formed in the thermal oxide and a thin oxide formed in the windows. The insulative quality of the gate insulation (to be later shaped to form the gate) is enhanced by depositing a layer of silicon nitride over the oxide. A layer of polycrystalline silicon is then deposited thereover. The layers of polycrystalline silicon, silicon nitride and silicon dioxide are selectively and sequentially etched to reveal the base silicon in the bottom of the original windows on either side of the polycrystalline silicon, silicon nitride and silicon dioxide layers. Diffused regions of a conductivity opposite to that of the original substrate are then formed to provide source and drain regions. While these diffusions are made the polycrystalline silicon becomes more conductive by the same dopant being diffused therein. By suitable metallization conductive connections can be made to the source and drain regions and to the polycrystalline silicon region to form source, drain and gate electrodes. This metallization will overly only thick oxide in regions not in ohmic contact with the desired regions.

One of the major reasons for the use of the silicon nitride layer in the foregoing process is the recognized defective structure of the thin thermal oxide. Defective is used in the sense that such an oxide would necessarily have to be of relatively great thickness to prevent shorting of the gate electrode to the channel. These defects are generally pinholes therein, although lattice defects may also be present. Thus, the silicon nitride allows a practical thickness of gate insulator. One of the biggest problems with the presence of the nitride layer is that in removing the layer for the diffusion step a separate etch step is required for its removal since the same etch cannot be used as for the polycrystalline silicon and the silicon dioxide. Also, the interface between the silicon dioxide and the silicon nitride can produce defects as a result of lattice strains.

SUMMARY OF THE INVENTION

It is an object of this invention to provide a process for the manufacture of improved MOS devices.

It is a further object of the invention to provide an improved process for the manufacture of high speed MOS devices.

It is a still further object of the invention to provide a process of manufacturing MOS devices which is more economical than prior processes.

In accordance with the objects, there is provided a process for the manufacture of MOS devices comprising the steps of:

(a) providing a suitably masked and etched wafer of P-semiconductor grade silicon in a deposition reactor; (b) heating the wafer to a temperature of approximately 950° C. while subjecting the wafer to dry oxygen gas to produce between a 50 and 250° C. layer of silica on a surface of the wafer; (c) elevating the temperature of the wafer to approximately 1000° C. while purging said chamber with nitrogen and then hydrogen gas; (d) beginning an introduction of carbon dioxide gas into the chamber; (e) introducing silane (SiH$_4$) or dichlorosilane into the chamber which reacts with the CO$_2$ to deposit silicon oxide on the thermally formed silica; (f) terminating the flow of silane after the desired thickness of vapor deposited oxide is placed on the wafer; and (g) introducing hydrogen gas while reducing the temperature of the wafer to room temperature prior to removal from the reactor.

THE DRAWINGS

Further objects and advantages of the invention will be understood from the following complete description thereof and from the drawings herein:

FIG. 1 is a cross-sectional perspective view of a portion of a self-aligned gate n-channel MOS device produced in accordance with the instant process; and FIGS. 2 to 5 are similar cross-sectional views of a portion of a semiconductor wafer at successive stages of manufacture leading to the structure of FIG. 1.

COMPLETE DESCRIPTION

As depicted in FIG. 1, an MOS integrated circuit 10 produced in accordance with the invention will include an MOS transistor comprising three electrodes, source electrode 11, drain electrode 12, and gate electrode 13, connected electrically to three semiconductor regions, source region 14, drain region 15 and channel region 16. These regions are defined in a body 17 of a semiconductor material of a first conductivity type, P- as shown, by bounding two sides of an area thereof by regions of a second conductivity type, N+. Thus, the two regions of N+ conductivity type are the source and drain regions 14 and 15 and the channel 16 is the region defined there between. The source and drain electrodes 11 and 12 are metallization stripes ohmically connected to these regions 14 and 15. Overlying the channel region is a composite insulating-conductor structure 18 which has a conductive (metal) layer as the surface thereof. This latter conductive layer is capacitively coupled to the channel region 16 through the insulative/conductive layers and serves as the gate electrode 13.

A device of this general structure has been produced previously by a process in which an overall relatively thick layer of silicon dioxide is thermally grown on a wafer of silicon. By masking and etching, windows are formed in the thermal oxide and a thin oxide formed in the windows. The insulative quality of the gate insulation to be later shaped is enhanced by depositing a layer of silicon nitride over the oxide. A layer of polycrystalline silicon is then deposited thereover. The layers of polycrystalline silicon, silicon nitride and silicon dioxide are selectively and sequentially etched to reveal the base silicon in the bottom of the original windows on either side of the polycrystalline silicon, silicon nitride and silicon dioxide layers. Diffused regions of a conductivity opposite to that of the original substrate are then formed to provide source and drain regions. While these diffusions are made, the polycrystalline silicon becomes more conductive by the same dopant being diffused therein. By suitable metallization conductive connections can be made to the source and drain regions and to the polycrystalline silicon region to form source, drain and gate electrodes. This metallization will overly only thick oxide in regions not in ohmic contact with the desired regions.

One of the major reasons for the use of the silicon nitride layer in the foregoing process is the recognized defective structure of the thin thermal oxide. Defective is used in the sense that such an oxide would necessarily have to be of relatively great thickness to prevent shorting of the gate electrode to the channel. These defects are generally pinholes therein, although lattice defects may also be present. Thus, the silicon nitride allows a practical thickness of gate insulator. One of the biggest problems with the presence of the nitride layer is that in removing the layer for the diffusion step a separate etch step is required for its removal since the source etch cannot be used as for the polycrystalline silicon and the silicon dioxide. Also, the interface between the silicon dioxide and the silicon nitride can produce defects as a result of lattice strains.

Figure 2:
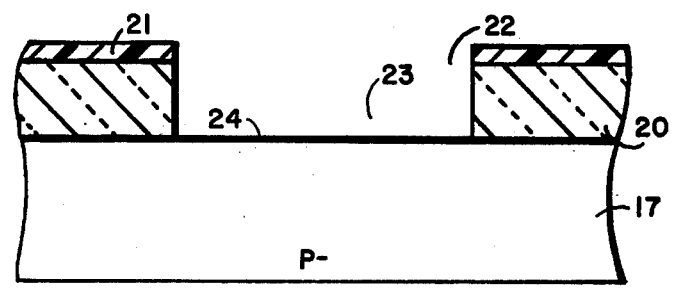
Figure 3:
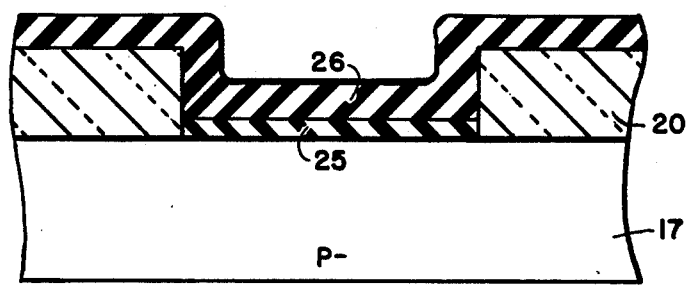
Figure 4:
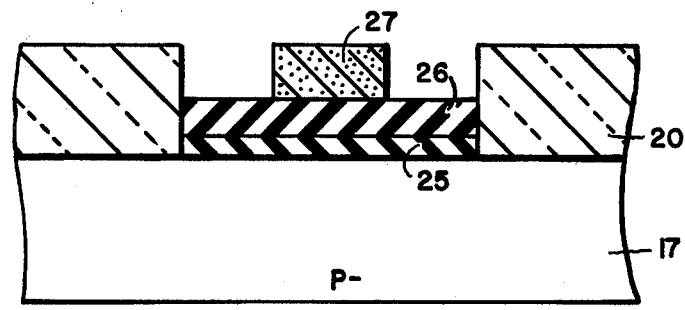

In accordance the present invention, a P-wafer 17 is provided with a relatively thick, 10,000Å layer 20 of silicon dioxide by any conventional technique, for example by exposing the surface of the wafer to steam at about 1000° C. Following application of a photoresist layer 21 thereto, the photoresist layer is exposed and developed to produce an opening 22 therein. A window 23 is then etched in the silicon dioxide layer 20 to expose a clean surface 24 of the P-silicon substrate 17 (FIG. 2).

Appropriate cleaning steps and precautions should be taken so that the wafer 17 and particularly surfaces 24 become and remain very clean while the wafer is placed in a suitable deposition reactor. While the description herein refers to a window and a wafer it will be understood that a typical process will operate on many windows in many wafers simultaneously. After the wafer or wafers are located in the reaction vessel, the chamber is purged with an inert gas, while the wafer is heated to approximately 950° C. Then dry oxygen gas is introduced to produce a thin layer 25 (FIG. 3) of silicon dioxide on the surface 24. The oxide layer 25 may be very thin and is preferrably between 50Å and 250Å thick. A deposited oxide layer 26 approximately 350Å thick is then provided on the layer 25 and the resultant sandwich annealed at ≈ 950° C. for 15 minutes in an oxygen ambient followed by 30 minutes in a nitrogen ambient to produce a defect free gate oxide which is 400–600Å thick.

The deposited oxide layer 26 is produced by the pyrolytic reduction of silane in the presence of carbon dioxide in accordance with the reactions:

$$H_2 + CO_2 \rightleftharpoons H_2O + CO \qquad (1)$$

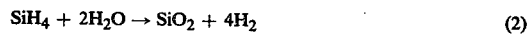

$$SiH_4 + 2H_2O \rightarrow SiO_2 + 4H_2 \qquad (2)$$

Thus, the wafer 17 is elevated to a temperature of approximately 1000° C. in a deposition chamber being purged with nitrogen and then hydrogen gas. Carbon dioxide gas is then introduced followed by injection of silane (SiH$_4$). Under these conditions, the oxide is produced at about 175 Å/minute, so after a reaction of approximately 2 minutes the desired 350Å layer is produced. The vapor deposited oxide layer 26 fills any pinholes or other defects in the thermal oxide 25. The vapor deposited oxide will grow preferentially on any high points or sharp edges present in the thermal oxide. Annealing is utilized to eliminate any lattice strains or defects at the thermal oxide/deposited oxide interface or may be considered to eliminate the interface.

The thermal layer and deposited layer may be formed in a single deposition chamber cycle by heating the wafer to a temperature of approximately 950° C. while subjecting the wafer to dry oxygen gas to produce between 50 and 250 Å of $SiO_2$ on a surface of the wafer; elevating the temperature of the wafer to approximately 1000° C. while purging said chamber with nitrogen and then hydrogen gas; beginning an introduction of carbon dioxide gas into the chamber; introducing silane ($SiH_4$) into the chamber which reacts with the $CO_2$ to deposit $SiO_2$ on the thermally formed $SiO_2$; terminating the flow of $SiH_4$ after the desired thickness of vapor deposited oxide is placed on the wafer; and introducing $H_2$ while reducing the temperature of the wafer to room temperature prior to removal from the reactor.

Figure 5:
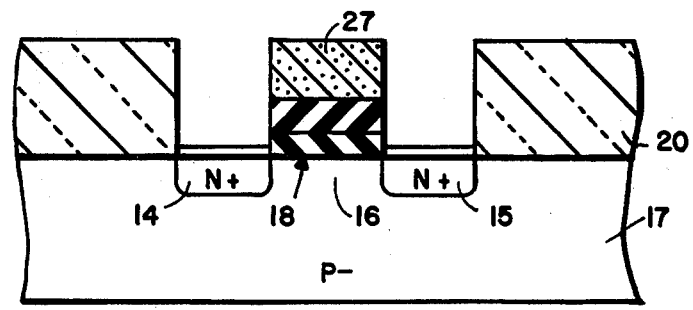

Following the deposition and anneal of the foregoing, a layer of polycrystalline silicon is deposited on the wafer. Following suitable masking and etching stops, the polycrystalline silicon gate 27 (FIG. 4) is formed over the center (approximate) of the window 23 overlying the thermal oxide 25 and the deposited oxide 26. Then, adjacent to the sides of the gate 27 the oxide layers 25 and 26 are removed and region 14 and 15 produced in the substrate 17 (FIG. 5). These regions, together with a doping of poly gate 27 may be accomplished by a standard arsenic deposition and diffusion process but preferably is done by an implant process.

Thus, following forming of the poly gate 27 and etch of the gate oxides, arsenic is implanted at a level of approximately $5 \times 10^{15}$ ions/cm². The implanted ion are diffused into the substrate by an anneal at 1050° C. for 15 minutes in nitrogen, then 70 minutes in oxygen followed by another 15 minutes in nitrogen. This produces an $x_j$ of about 0.68 m with a V/I of about 4.0 ohms. Standard metallization techniques may then be used to produce the metallized electrodes 11, 12 and 13 of FIG. 1.

While the process has been depicted in connection with a planar gate MOS device, it will be understood that the increased voltage breakdown capability attained herewith is equally applicable to VMOS devices or other MOS type devices. Therefore, while the invention has been described by way of the preferred specific embodiment thereof, it will be appreciated that suitable modifications may be made therein without departing from the spirit and scope of the invention.

What is claimed is:

1. A process for the manufacture of MOS devices comprising the steps of:

heating a silicon wafer to a temperature of approximately 950° C. while subjecting the wafer to dry oxygen gas to produce between 50 and 250 Å of $SiO_2$ on a surface of the wafer;

elevating the temperature of the wafer to approximately 1000° C. while purging the chamber with nitrogen and then hydrogen gas;

beginning an introduction of carbon dioxide gas into the chamber;

introducing silane ($SiH_4$) into the chamber which reacts with the $CO_2$ to deposit $SiO_2$ on the thermally formed $SiO_2$;

terminating the flow of $SiH_4$ after the desired thickness of vapor deposited oxide is placed on the wafer; and introducing $H_2$ while reducing the temperature of the wafer to room temperature prior to removal from the chamber.

2. A process as recited in claim 1 wherein said annealed layers form the gate insulation and a polycrystalline silicon gate electrode is formed thereover.

3. A process as recited in claim 1 and further including the step of annealing the layers for 15–60 minutes.

4. A process for the manufacture of MOS devices comprising the steps of:

providing a masked and etched wafer of P-semiconductor grade silicon in a deposition chamber;

heating the wafer to a temperature of approximately 950° C. while subjecting the wafer to dry oxygen gas to produce a layer of $SiO_2$ on a surface of the wafer;

elevating the temperature of the wafer to approximately 1000° C. while purging said chamber with nitrogen and then hydrogen gas;

beginning an introduction of carbon dioxide gas into the chamber;

introducing silane ($SiH_4$) into the chamber which reacts with the $CO_2$ to deposit approximately 350Å of $SiO_2$ on the thermally formed $SiO_2$;

terminating the flow of $SiH_4$ after the desired thickness of vapor deposited oxide is placed on the wafer; and introducing $H_2$ while reducing the temperature of the wafer to room temperature prior to removal from the chamber.

5. A process as recited in claim 3 and further including an arsenic implant procedure to produce source and drain regions.

6. A process for the manufacture of MOS devices comprising the steps of: heating a silicon wafer to a high temperature while subjecting the wafer to dry oxygen gas to produce a layer of $SiO_2$ on a surface of the wafer;

elevating the temperature of the wafer while purging the chamber with nitrogen and then hydrogen gas;

beginning an introduction of carbon dioxide gas into the chamber;

introducing silane ($SiH_4$) into the chamber which reacts with the $CO_2$ to deposit $SiO_2$ on the thermally formed $SiO_2$ layer;

terminating the flow of $SiH_4$ after the desired thickness of vapor deposited oxide is placed on the wafer; and introducing $H_2$ while reducing the temperature of the wafer prior to removal from the chamber.

7. A process as recited in claim 6 and further including the step of annealing the layers for 15 to 60 minutes.

8. A process as recited in claim 7 wherein said annealed layers form the gate insulation and a polycrystalline silicon gate electrode is formed thereover.

9. A process as recited in claim 8 and further including an arsenic implant procedure to produce source and drain regions.

* * * * *